United States Patent
Guo

(10) Patent No.: US 6,801,063 B1
(45) Date of Patent: Oct. 5, 2004

(54) CHARGE COMPENSATED BOOTSTRAP DRIVING CIRCUIT

(75) Inventor: Sam Yonghong Guo, Canton, MI (US)

(73) Assignee: Yazaki North America, Inc., Canton, MI (US)

( * ) Notice: Subject to any disclaimer, the term of this patent is extended or adjusted under 35 U.S.C. 154(b) by 0 days.

(21) Appl. No.: 10/463,722

(22) Filed: Jun. 17, 2003

(51) Int. Cl.[7] ................................................ H03B 1/00
(52) U.S. Cl. ........................................ 327/108; 327/538
(58) Field of Search ............................... 327/108, 172, 327/390, 535–541, 543–546, 548, 589; 323/224, 284, 288

(56) References Cited

U.S. PATENT DOCUMENTS

| | | |
|---|---|---|
| 4,049,979 A | 9/1977 | Shieu et al. |
| 4,284,905 A | 8/1981 | Rosenzweig |
| 4,376,252 A | 3/1983 | Masenas, Jr. |
| 4,772,812 A | 9/1988 | Desmarais |
| 4,992,749 A | 2/1991 | Tokumo et al. |
| 5,498,995 A * | 3/1996 | Szepesi et al. .............. 327/538 |
| 5,708,343 A * | 1/1998 | Hara et al. .................. 318/599 |
| 6,002,269 A | 12/1999 | Dartnell et al. |
| 6,107,860 A * | 8/2000 | Vinciarelli .................. 327/427 |
| 6,201,717 B1 | 3/2001 | Grant |
| 6,246,296 B1 | 6/2001 | Smith |
| 6,489,758 B2 * | 12/2002 | Moriconi et al. ........... 323/288 |

* cited by examiner

*Primary Examiner*—My-Trang Nu Ton
(74) *Attorney, Agent, or Firm*—Radar, Fishman & Grauer PLLC

(57) ABSTRACT

A circuit and method for electrically driving a load. A bootstrap driving circuit variably drives the load in response to a pulse width modulation control signal. A compensation curcuit then permits the bootstrap driving circuit to drive the load at a maximum power level when the pulse width modulation control signal has a sufficiently high enough duty cycle.

23 Claims, 2 Drawing Sheets

CHARGE COMPENSATED BOOTSTRAP DRIVING CIRCUIT

FIELD OF THE INVENTION

The present invention relates to a new circuit and method for controlling the driving of a load, and more specifically, a driving circuit, controlled by a pulse width modulated signal, that is capable of driving a load at a maximum power level.

BACKGROUND OF THE INVENTION

A variety of today's electrical systems rely on pulse width modulation (PWM) of a signal to control analog circuits and devices in a digital manner. According to basic PWM techniques, a voltage or current source is supplied to an analog load, such as a motor, by means of a repeating series of on or off pulses. The power supply is fully on and applied to a load only during the on-times defined by the repeating series of on and off pulses. The subsequent ratio of on-time to period of the signal is known as the duty cycle of a PWM signal and is expressed in percentages. Thus, a PWM signal with a 50% duty cycle represents a signal comprised of on pulses for half of the time, while a 100% duty cycle represents the power supply being continuously applied to a load.

PWM signal control is often utilized with bootstrap-type driving circuits, which rely on the use of a first power supply to activate or turn "on" a circuit that subsequently drives a load using a second power supply. FIG. 1 illustrates the general layout of a known bootstrap-type driving circuit 100 that utilizes a pulse width modulated control signal. In general, the purpose of circuit 100 is to drive load 130 using a primary power supply Vp. This is carried out by means of switch 120. When switch 120 is placed in an "on" state, electrical current to flows from the primary power supply Vp, through the switch 120, to the load 130, and when switch 120 is "off", no current flows from primary power supply Vp to the load.

Controlling the "on" and "off" state of primary switch 120 is a secondary switch 140 that "flips" between a first and second state, thereby connecting either a first path (A) or second path (B) to capacitance 150, depending on a PWM control signal Vin. Specifically, when the control signal Vin is off/low, switch 140 is placed in a first state whereby capacitance 150 is connected to an auxiliary power supply Va, such as, for example, a 12 Volt source, through first circuit path (A). Accordingly, when control signal Vin is off/low, switch 120 remains in its default "off" state. At the same time, capacitance 150 is charged by electrical current that is permitted to flow from the auxiliary power supply Va, to the capacitance 150, and then through the load 130.

When control signal Vin is on/high, secondary switch 140 is placed in a second state whereby capacitance 150 is connected to primary switch 120 by means of the second path (B). This results in primary switch 120 turning "on" due to application of the built-up charge stored in capacitance 150. Consequently, with switch 120 "on", the primary power supply Vp is able to drive load 130.

Accordingly, when the PWM control signal Vin, applied to secondary switch 140, is off/low, primary switch 120 remains off while capacitance 150 is charged. Conversely, when control signal Vin is high, the built-up charge on capacitance 150 is applied to primary switch 120, thereby placing switch 120 in an "on" state and allowing the primary power supply Vp to drive load 130 until the PWM control signal Vin goes off/low again.

The bootstrap-type driving circuit described above works sufficiently for driving a load 130 at less than maximum power levels, such as, for example, upon application of a control signal Vin having less than a 100% duty cycle. However, complications arise when one attempts to fully drive load 130 at a maximum power level. This is because bootstrap-type driving circuits utilizing PWM control, as generally described above, are unable to function properly upon the application of a PWM control signal Vin having a sufficiently high duty cycle. The reason for this is because at sufficiently high duty cycle levels, such as, for example, a 100% duty cycle, PWM signals are effectively converted from a series of on and off pulses to a constant voltage or current signal. Application of an essentially constant control signal Vin to circuit 100 above results in secondary switch 140 being placed in its secondary state. Furthermore, secondary switch 140 will remain in its secondary state for as long as the essentially constant control signal Vin is applied. During this time period, capacitance 150 is connected to primary switch 120, with the charge on capacitance 150 placing switch 120 in an "on" state. However, capacitance 150, like all capacitances, is subject to a condition known as "voltage droop", whereby, in the absence of periodic recharging, which normally occurs at lower duty cycles, the stored charge on capacitance 150 quickly diminishes due to current leakage. Consider, for example, the situation where a control signal having a 100% duty cycle is applied to the circuit. Unless capacitance 150 is periodically recharged, the stored charge on capacitance 150 may only last a few milliseconds before being reduced to an insufficient voltage amount. Yet, because of the high duty cycle of the control signal, capacitance 150 will not be provided with a chance to recharge. As a result, after those few milliseconds, the charge stored on capacitance 150 is no longer sufficient to maintain the primary switch 120 in an "on" state.

Accordingly, the application of a PWM input signal Vin having a sufficiently high enough duty cycle results in a lack of periodic recharging of capacitance 150. Consequently, without periodic recharging of capacitance 150, voltage droop becomes a significant factor, leading to capacitance 150 having an insufficient charge to maintain primary switch 120 in an "on" state. As a result, the inventor of the present invention has realized the need for a bootstrap-type driving circuit that utilizes a pulse width modulated (PWM) control signal to control the variable driving of a load, including driving the load at or near a maximum power level upon the application of a sufficiently high enough PWM control signal.

SUMMARY OF THE INVENTION

The present invention relates to a circuit and method for electrically driving a load. The circuit includes the use of a driving circuit for variably driving the load in response to a pulse width modulated control signal. Also included is a compensation circuit that permits the driving circuit to drive the load at a maximum power level when the pulse width modulation control signal has a sufficiently high enough duty cycle.

DESCRIPTION OF THE PREFERRED EMBODIMENT

Figure 1:
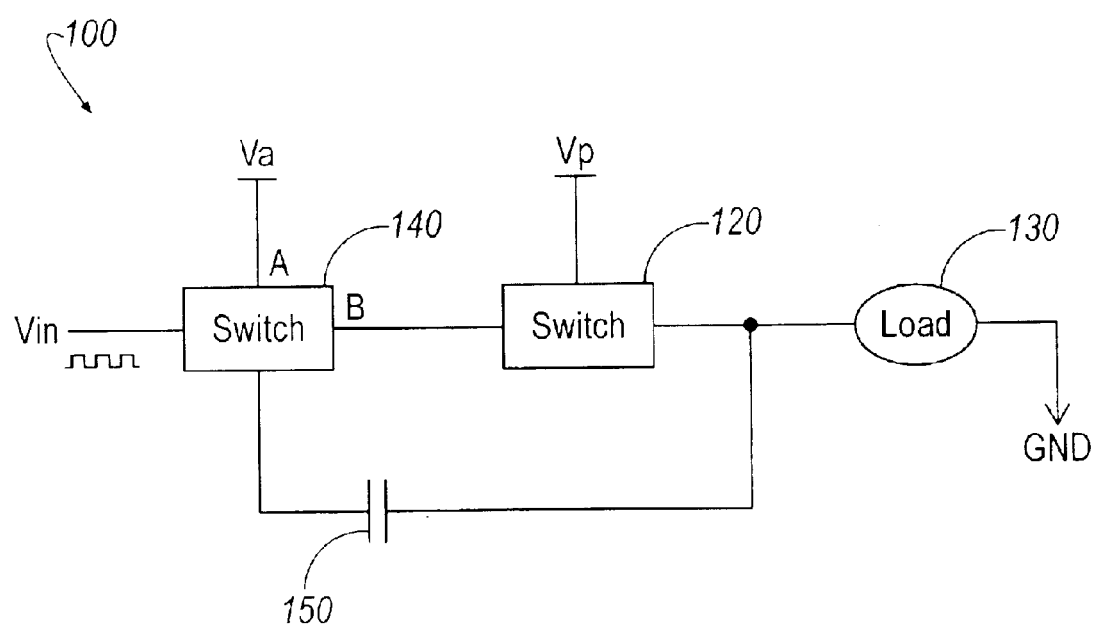
FIG. 1 is a general illustration of a typical driving circuit, utilizing a pulse width modulated control signal, for driving a load.
Figure 2:
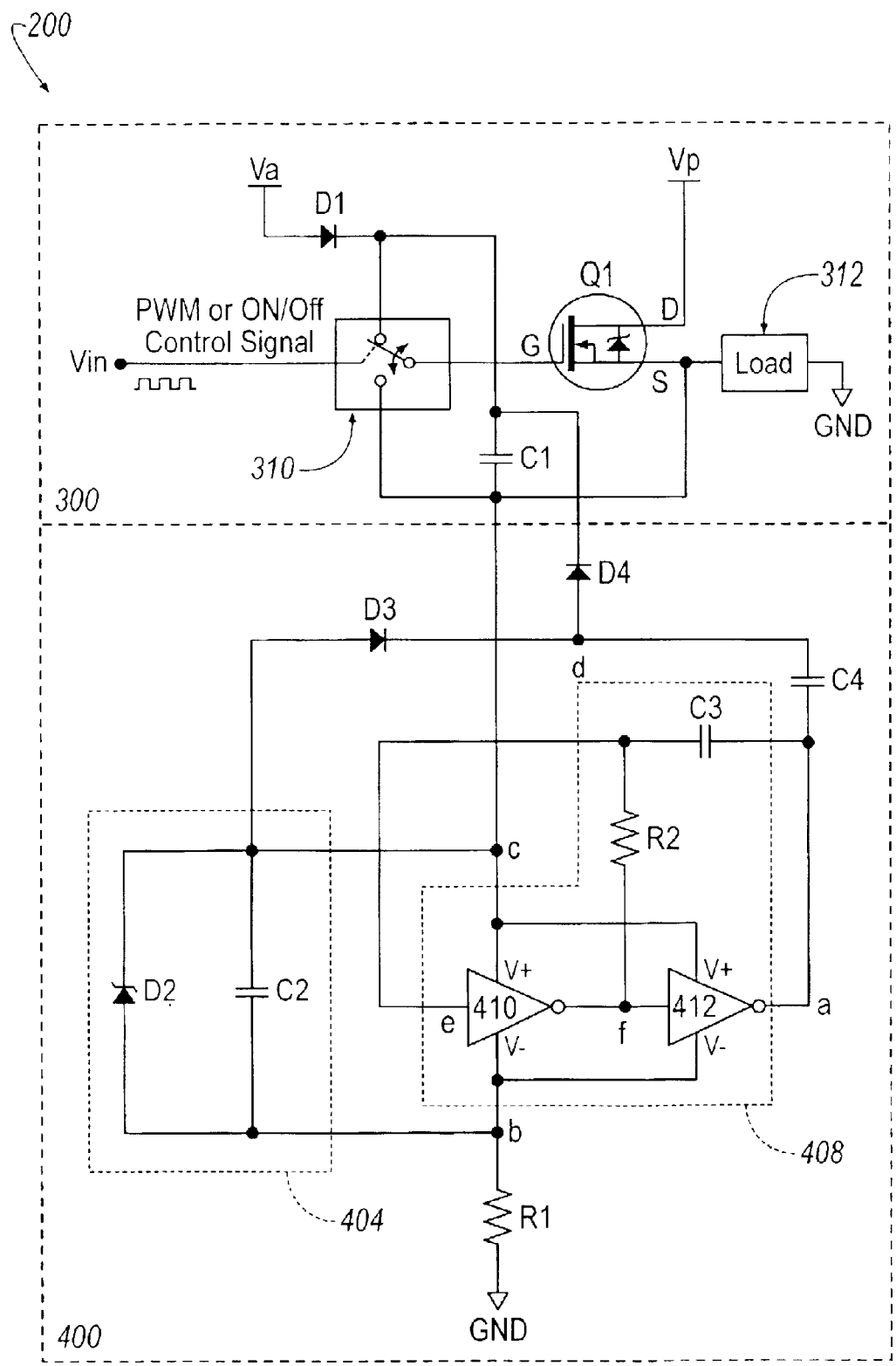
FIG. 2 is a circuit diagram that illustrates an exemplary embodiment of the present invention.

One embodiment of the present invention will now be described in reference to FIG. 2. Illustrated in FIG. 2 is a bootstrap-type driving circuit 200 that utilizes pulse width modulation (PWM) as the means for controlling the power level at which a load 312 is driven. As depicted in FIG. 2, circuit 200 is comprised of two circuit portions: (1) a driving circuit 300, and (2) a compensation circuit 400.

The driving circuit 300 includes an auxiliary power supply Va and a primary power supply Vp. Both the auxiliary power supply Va and the primary power supply Vp can be any desired voltage. The primary power supply Vp is connected to a load 312 through transistor Q1, which acts as a switch. The auxiliary power supply Va is connected to capacitor C1 through a diode D1, and then continues on to the load. A pulse width modulated (PWM) signal Vin is applied to bi-model switch 310, which is placed in either a first or second state depending on control signal Vin. When in a first state, switch 310 is configured to allow auxiliary power supply Va to charge up capacitance C1. When switch 310 is placed in its second state, the charge stored on capacitance C1 is applied to the gate G of transistor Q1. Diode D1 functions to protect the auxiliary power supply Va from any extraneous current generated by a voltage higher than that of auxiliary power supply Va. Transistor Q1 is disclosed as being a metal oxide semiconductor field effect transistor (MOSFET), but other types of transistors may be used as well.

The compensation circuit 400 includes a voltage source/regulator 404, effectively comprising a zener diode D2 and capacitance C2, and a type of oscillation circuit 408, effectively comprising inverters 410 and 412, capacitance C3 and resistance R2. Inverters 410 and 412 receive power from the primary power source Vp by means of the electrical connection established between the source side S of transistor Q1 and the power input terminals V+ of the inverters 410, 412. Both inverters 410 and 412 are also connected to ground through a resistance R1. Based on the state of oscillation circuit 408, a capacitance C4 either receives a charging current generated by voltage source 404 and provided through diode D3, or, alternatively, generates its own charging current that it provides to capacitance C1 through diode D4.

In general, when transistor Q1 is placed in an "on" state, electrical current is able to flow from the primary power supply Vp, through the transistor Q1, to the load 312, thereby driving the load 312. The operating state of transistor Q1 is controlled by switch 310. Upon application of a pulse width modulated control signal Vin, switch 310 cycles the capacitance C1 back and forth between a first, charging state and a second state whereby the charge stored in capacitance C1 is able to forward-bias the gate G of transistor Q1, thereby turning transistor Q1 on. As the duty cycle of control signal Vin increases, transistor Q1 is placed in an "on" state for a longer period of time, thereby allowing electrical current to flow to load 312 for an overall greater period of time. However, as the duty cycle of control signal Vin increases to a sufficiently high enough level, capacitance C1 cannot maintain its stored charge while placed in its second state for an extended period of time. In order to maintain the charge stored in capacitance C1 during this extended period of time, compensation circuit 400 subsequently provides a charging current to capacitance C1.

The operation of the illustrated embodiment of circuit 200 will now be described in greater detail. A pulse width modulated (PWM) control signal Vin, representing a series of "on" and "off" pulses, is applied to switch 310. When the control signal Vin is low, representing an "off" pulse, switch 310 "flips" down to a first state. When signal Vin is high, representing an "on" pulse, switch 310 "flips" up to a second state.

When control signal Vin is low, and switch 310 is "flipped" down into a first state, the gate G of transistor Q1 is short circuited with the source S of Q1, thereby placing transistor Q1 in an "off" state. During this time when Q1 is off, capacitance C1 is charged by current that flows from the auxiliary power supply Va, through diode D1, to the capacitance C1 onto the load 312, and then to GND.

When the control signal Vin is high, switch 310 "flips" up into a second state, thereby reconfiguring the driving circuit 300 so that capacitance C1 is placed between the source S of transistor Q1 and gate G of transistor Q1. The stored charge in C1 is sufficient to forward-bias the gate G of Q1, thereby turning on transistor Q1 and permitting the primary power supply Vp to drive the load 312.

In the above manner, load 312 can be driven at varying power levels by adjusting the duty cycle of control signal Vin, which controls the rate at which switch 310 repetitively flips back and forth between its first and second states. Consequently, capacitance C1 is alternated between a first state of being charged by the auxiliary power supply, and a second state of being connected to the gate G and source S of transistor Q1. Upon the application of a control signal Vin having a sufficiently high enough duty cycle, such as, for example, a duty cycle at or near 100%, capacitance C1 is placed between the gate G and source S of transistor Q1 for an extended period of time. As such, capacitance C1 is unable to be recharged, as it normally would be, by auxiliary power supply Va. This would disable the typical PWM controlled bootstrap driving circuit. However, according to the present invention, this is when the effects of the compensation circuit 400 become noticeable.

Generally speaking, compensation circuit 400 functions as an alternative power supply designed to maintain the charge stored on capacitance C1 whenever transistor Q1 is placed in an "on" state. The inverter-based oscillation circuit 408 generates an output voltage that switches back and forth between a low and high state. When the output voltage generated by oscillation circuit 408 is low, capacitance C4 is charged through D3 by the compensation circuit's voltage source 404. When the output voltage generated by oscillation circuit 408 is high, electrical current is able to flow from capacitance C4, through diode D4, to capacitance C1, thereby allowing capacitance C4 to compensate for the decrease in charge on C1 caused by leakage currents.

Consider the following example, wherein, for illustrative purposes only, primary power supply Vp is assumed to be a 300 volt power source while the auxiliary power supply Va is assumed to be a 12 volt power source. When transistor Q1 is on, the voltage at source S of Q1 can be considered to be roughly equal to 300 volts due to the minimal voltage drop across transistor Q1. The voltage at reference point (c) within compensation circuit 400 is thus also roughly equal to 300 volts. For the present example, assume, again for illustrative purposes only, that the breakdown voltage of zener diode D2 is 13 volts. In the present embodiment, zener diode D2 functions as a voltage regulator, and as a result of its rated breakdown voltage, diode D2 allows only a 13 volt differential voltage to be applied to the inverters 410 and 412 upon transistor Q1 turning on. Consequently, the voltage at reference point (b) is found to be roughly equal to 287 volts.

Upon inverters 410 and 412 first turning on, the input to inverter 410, illustrated in FIG. 2 as reference point (e), is at a relatively low value. Based on this low input voltage Ve, inverter 410 generates a high output voltage Vf, which subsequently becomes the input voltage to inverter 412, which in response to a high input voltage, generates a low output voltage Va. As the output voltage Vf is greater than Va, electrical current will flow from the output of inverter 410, through resistance R2, to capacitance C3, thereby causing a charge to accumulate on capacitance C3. As the charge stored on capacitance C3 increases, the input voltage Ve to inverter 410 also increases. Voltage Ve continues to increase until it exceeds the threshold voltage level of inverter 410, causing inverter 410 to generate a low output voltage Vf. In response to the low voltage Vf, inverter 412 generates a high output voltage Va. With the sudden change in polarity between reference points (a) and (f), capacitance C3 is discharged through R2. Voltage Ve will decrease while C3 is discharging. When voltage Ve drops below the threshold voltage of inverter 410, the inverter once again generates a high output voltage Vf. This subsequently causes inverter 412 to again generate a low output voltage Va. The above cycle then simply repeats for as long as power is supplied to the inverters 410 and 412. Accordingly, output voltage Va is found to cycle back and forth between a low and high value.

When voltage Va is in a low state, capacitance C4 accumulates charge. Specifically, the low output voltage Va generated by inverter 412 is roughly equal in value to the voltage level found at reference point (b). This creates a voltage differential between reference point (c) and point (a) on the circuit. Consequently, electrical current flows from voltage source 404, through diode D3, toward point (a), causing a charge to build-up on capacitance C4 that is roughly equal in value to the 13 volt differential between reference points (c) and (b).

Upon the triggering of inverter 412, voltage Va switches from a low to high state, becoming roughly equal in value to the voltage level at reference point (c). Once Va switches to this high state, electrical current flows from capacitance C4, through diode D4, to capacitance C1, thereby compensating for the loss of charge on C1 due to leakage current. The greater the loss of charge, or leakage, in capacitance C1, the more charge capacitance C4 can compensate. Based on the present invention, the final voltage across capacitance C1 is capable of being compensated to a value equal to the voltage across capacitance C4, which is dependent upon the break-down voltage of zener diode D2.

Accordingly, the present invention provides a bootstrap-type driving circuit 200 capable of driving a load at varying power levels based upon a pulse width modulated (PWM) control signal. Furthermore, the driving circuit 200 is capable of driving a load at a maximum power level upon submission of a PWM control signal having a sufficiently high enough duty cycle, such as, for example, a signal having a 100% duty cycle.

While the invention has been specifically described in connection with certain specific embodiments thereof, it is to be understood that this is by way of illustration and not of limitation, and the scope of the appended claims should be construed as broadly as the prior art will permit.

What is claimed is:

1. A circuit for driving a load, comprising:
   a first switch configured to selectively connect a voltage source to the load and disconnect said voltage source from the load;
   a depletable store of electrical charge configured to cause said first switch to alternatively be in a first state and a second state in response to a pulse width modulated control signal; and
   a compensation circuit configured to replenish said store of electrical charge when said store of electrical charge is connected to said first switch.

2. The circuit according to claim 1, wherein said store of electrical charge is configured into one of a first and second state in response to said pulse width modulation control signal.

3. The circuit according to claim 2, further comprising a second switch receiving said pulse width modulated control signal, said second switch configuring said store of electrical charge into said one of said first and second state.

4. The circuit according to claim 2, wherein said store of electrical charge receives a first charging current when configured into said first state, and said store of electrical charge is connected to said first switch when configured into said second state.

5. The circuit according to claim 4, wherein said first charging current is provided by an auxiliary voltage source.

6. The circuit according to claim 2, wherein said store of electrical charge remains in said second state when said pulse width modulated control signal has a sufficiently high enough duty cycle, and said store of electrical charge cycles back and forth between said first state and second state when said pulse width modulated control signal does not have a sufficiently high enough duty cycle.

7. The circuit according to claim 1, wherein said first switch comprises a transistor.

8. The circuit according to claim 7, wherein said store of electrical charge turns on said transistor by forward biasing a gate of said transistor.

9. The circuit according to claim 1, wherein said compensation circuit comprises:
   a second depletable store of electrical charge for providing a second charging current to said first store of electrical charge;
   a voltage regulator for controlling a magnitude of said second store of electrical charge; and
   an oscillation circuit configured to cause said second store of electrical charge to be in one of a first and second state, said second store of electrical charge providing said second charging current to said first store of electrical charge when placed in said first state, and said second store of electrical charge receiving a third charging current when placed in said second state.

10. The circuit according to claim 9, wherein said voltage regulator is a zener diode.

11. The circuit according to claim 9, wherein said oscillation circuit comprises first and second inverters configured in series with one another, a capacitor configured in parallel with said first and second inverters, and a series of a resistor and said capacitor configured in parallel with said second inverter.

12. The circuit according to claim 11, wherein said oscillation circuit generates an output voltage that cycles back and forth between a first higher voltage value and a second lower voltage value.

13. The circuit according to claim 1, wherein the load can be driven at a maximum power level when said pulse width modulated control signal has a sufficiently high enough duty cycle.

14. A method for driving a load in response to a pulse width modulated control signal, comprising the steps of:
   providing a first charging current to a first depletable store of electrical charge when said pulse width modulated control signal is in a low state;

activating a switch with said first store of electrical charge when said pulse width modulated control signal is in a high state, said switch permitting an electrical current to flow to the load; and providing a second charging current to said first store of electrical charge when said switch is activated.

15. The method according to claim 14, wherein said second charging current originates from a second depletable store of electrical charge.

16. The method according to claim 15, further comprising the steps of:

generating a reference voltage that cycles back and forth between a first voltage level and a second voltage level;

providing a third charging current to said second store of electrical charge when said reference voltage is at said first voltage level; and generating said second charging current by said second store of electrical charge when said reference voltage is at said second voltage level.

17. The method according to claim 14, further comprising the steps of:

driving the load at a maximum power level when said pulse width modulation control signal has a sufficiently high enough duty cycle; and driving the load at a less than maximum power level when said pulse width modulated control signal does not have a sufficiently high enough duty cycle.

18. A circuit for electrically driving a load, comprising:

a driving circuit for variably driving the load in response to a pulse width modulation control signal, said driving circuit including a first switch that is activated by a first depletable store of electrical charge; and a compensation circuit providing a first charging current to said first store of electrical charge when said first store of electrical charge is activating said first switch, thereby permitting said driving circuit to drive the load at a maximum power level when said pulse width modulated control signal has a sufficiently high enough duty cycle.

19. The circuit according to claim 18, wherein said driving circuit further comprises a second switch, responsive to said pulse width modulated control signal, for selectively applying said first store of electrical charge to said first switch.

20. The circuit according to claim 18, wherein said compensation circuit comprises:

a second depletable store of electrical charge for providing said first charging current to said first store of electrical charge;

a voltage regulator for controlling a magnitude of said second store of electrical charge; and an oscillation circuit configured to cause said second store of electrical charge to be in one of a first and second state, said second store of electrical charge providing said first charging current to said first store of electrical charge when placed in said first state, and said second store of electrical charge receiving a second charging current when placed in said second state.

21. The circuit according to claim 20, wherein said oscillation circuit comprises first and second inverters configured in series with one another, a capacitor configured in parallel with said first and second inverters, and a series of a resistor and said capacitor configured in parallel with said second inverter.

22. A circuit for driving a load, comprising:

first switching means for selectively connecting a voltage source to the load;

second switching means for controlling said first switching means in response to a pulse width modulated control signal by selectively applying a depletable store of electrical charge to said first switching means; and means for maintaining said store of electrical charge when said store of electrical charge is applied to said first switching means.

23. The circuit according to claim 22, wherein said means for maintaining said store of electrical charge comprises:

charging means for supplying a charging current to said store of electrical charge;

regulating means for regulating a magnitude of said charging current; and control means for repetitively switching said charging means between a first and second state, said charging means supplying said charging current only when in one of said first and second state.

* * * * *